(12) United States Patent
Lenhard

(10) Patent No.: US 6,177,791 B1
(45) Date of Patent: Jan. 23, 2001

(54) CURRENT SENSOR ACCORDING TO THE COMPENSATION PRINCIPLE

(75) Inventor: Friedrich Lenhard, Hanau (DE)

(73) Assignee: Vacuumschmelze GmbH, Hanau (DE)

(*) Notice: Under 35 U.S.C. 154(b), the term of this patent shall be extended for 0 days.

(21) Appl. No.: 09/355,609

(22) PCT Filed: Feb. 11, 1998

(86) PCT No.: PCT/DE98/00379

§ 371 Date: Jul. 30, 1999

§ 102(e) Date: Jul. 30, 1999

(87) PCT Pub. No.: WO98/36282

PCT Pub. Date: Aug. 20, 1998

(30) Foreign Application Priority Data

Feb. 14, 1997 (DE) .............................. 197 05 768

(51) Int. Cl.$^7$ .................................................. G01R 1/20
(52) U.S. Cl. ...................................... 323/357; 324/117 R
(58) Field of Search .................................. 323/355, 356, 323/357, 358; 324/117 R, 127

(56) References Cited

U.S. PATENT DOCUMENTS 5,565,765  10/1996  Lenhard ..................... 324/117 R

FOREIGN PATENT DOCUMENTS

| 295 20 066 U1 | 2/1996 | (DE) . |
| 0 356248 A1 | 2/1990 | (EP) . |
| 0 691 544 Aa | 1/1996 | (EP) . |
| 2 692 991 | 12/1993 | (FR) . |

*Primary Examiner*—Jessica Han
(74) *Attorney, Agent, or Firm*—Hill & Simpson

(57) ABSTRACT

Current sensor according to the compensation principle, in which the magnetic field produced by a primary winding (1) through which the current to be measured flows is compensated by the compensation current in a secondary winding (6), and in which for the controlling of the compensation current at least one sensor (3) that is influenced by the magnetic field acquires deviations from the zero current and supplies this measurement value to a driver circuit (5) for the production of the compensation current, whereby at the output of the driver circuit (5) the secondary winding (6) is connected in series to a terminating resistance (7), a voltage (Ua) that is proportional to the current to be measured is present at the terminating resistance (7), two amplifiers (5a,5b) in a bridge circuit, which are controlled by the measurement value and which supply output signals in phase opposition to one another, are used as a driver circuit (5), and the series circuit of the secondary winding (6) and terminating resistance (7) is connected between the outputs of the amplifiers.

5 Claims, 2 Drawing Sheets

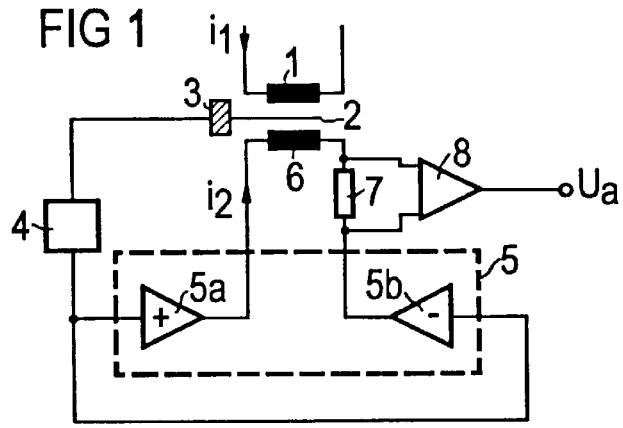
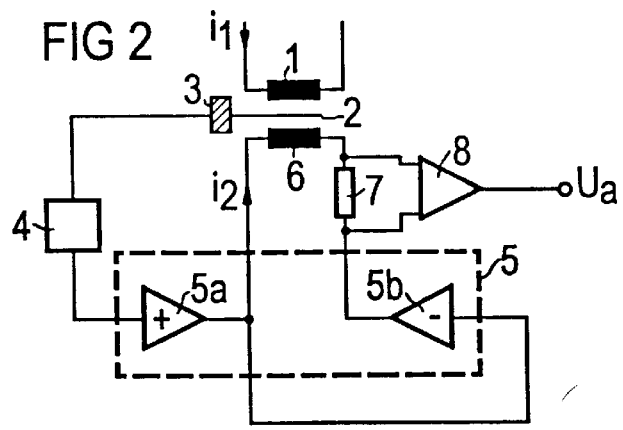
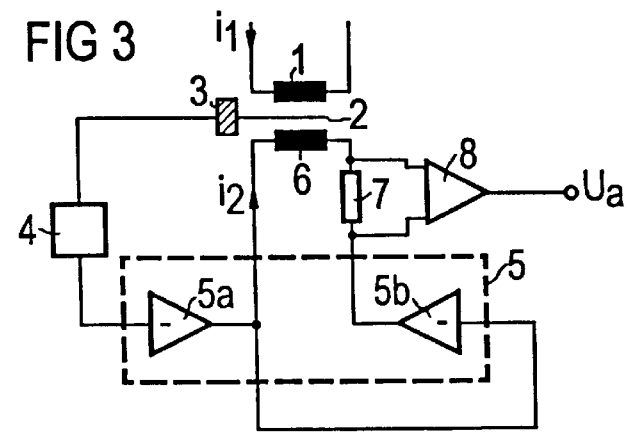

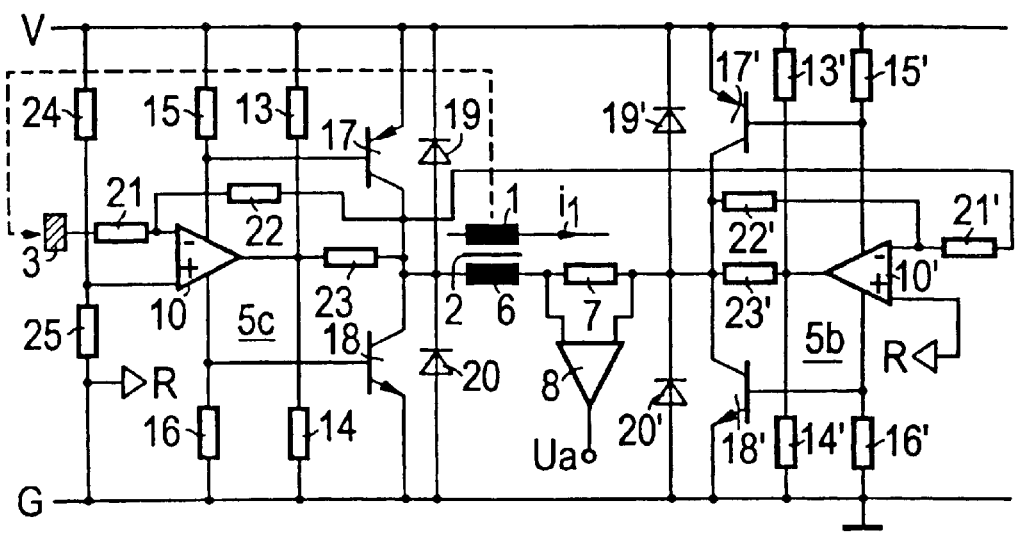

CURRENT SENSOR ACCORDING TO THE COMPENSATION PRINCIPLE

BACKGROUND OF THE INVENTION

The present invention relates to a current sensor according to the compensation principle, in which the magnetic field produced by a primary winding through which the current to be measured flows is compensated by the compensation current in a secondary winding, and in which for the controlling of the compensation current at least one sensor that is influenced by the magnetic field acquires deviations from the zero current and supplies this measurement value to a driver circuit for the production of the compensation current, whereby at the output of the driver circuit the secondary winding is connected in series to a terminating resistance, and a voltage that is proportional to the current to be measured is present at the terminating resistance.

A current sensor of this type according to the compensation principle is for example known from European Reference EP 356 248 and from European Reference EP 691 544, and is shown in FIG. 5 of the drawing. The current $i_1$ that is to be measured thereby flows through the primary winding 1 of a current transformer, which for example comprises a magnet core 2 as well as a sensor 3 that measures the magnetic flux in the magnet core 2.

The sensor 3 consists for example of a transformer driven to saturation, with a rectangular magnetization characteristic. The output voltage of the sensor 3 is processed in a subsequently connected evaluation circuit 4; a driver circuit 5 is in turn connected downstream therefrom. The output of the driver circuit 5 is connected with a reference potential G via the secondary winding 6 of the current transformer and a terminating resistance 7.

The current to be measured now produces, via the primary winding 1, a magnetic flux in the magnet core 2, which flux is acquired by the sensor 3. The evaluation circuit 4 connected after the sensor 3 supplies a signal—which is dependent on the magnitude and direction of the magnetic field in the magnet core 2—to the driver circuit 5, which signal drives a compensation current $i_2$ through the secondary winding 6. The compensation current $i_2$ is oriented in such a way that its magnetic field compensates the magnetic flux in the magnet core 2. The current in the secondary winding 6 is altered by the sensor 3 in connection with the evaluation circuit 4, the driver circuit 5, and the secondary winding 6 until the magnetic field in the magnet core 2 goes to zero. The current $i_2$ in the secondary winding 6 is thereby a measure for the momentary value of the current $i_1$ to be measured in the primary winding 1, whereby both direct and alternating currents can be acquired. In addition, the current $i_2$ flows via a terminating resistance 7 at which the output voltage Ua of the current sensor falls off, which output voltage thereby corresponds in magnitude and phase position to the current $i_1$ to be measured in the primary winding 1.

The maximum measurable current $i_{1max}$ of the compensation current sensor is thereby:

$$i_{1max}=w_2 \cdot (U_V-U_B)/(R_i+R_a),$$

whereby $w_2$ is equal to the number of secondary windings, $U_V$ is equal to the supply voltage, $U_B$ is equal to the voltage drop in the driver stage 5, $R_i$ is equal to the internal resistance of the secondary winding 6 and $R_a$ is equal to the resistance value of the terminating resistance 7.

The known compensation current sensors operate predominantly with a terminating resistance that is connected in series with the secondary winding against a reference potential. By this means, for the compensation of a positive current a positive (or, respectively, negative) supply voltage is required, and for the compensation of a negative current a negative (or, respectively, positive) supply voltage is required. As a consequence, a bipolar voltage supply must be provided. If no such voltage supply is available, two bipolar voltages can be obtained from a unipolar voltage source by voltage halving; however, the individual voltage values thereof are thereby also halved. However, due to the halved voltage values the maximal measurable voltage is also reduced according to the above equation.

SUMMARY OF THE INVENTION

The object of the invention is to indicate a current sensor that operates according to the compensation principle, with a unipolar voltage supply, and that does not have these disadvantages.

According to the invention, the current sensor named above is developed in such a way that two amplifiers in a bridge circuit, which are controlled by the measurement value and which supply output signals in phase opposition to one another, are used as a driver circuit, whereby the series circuit of the secondary winding and terminating resistance is connected between the outputs of the amplifiers.

Preferably, two push-pull output stages operated in a bridge circuit are provided. The measurement value of the sensor is thereby supplied mediately or immediately to the two push-pull output stages that are operated in a bridge circuit. The outputs of the two push-pull output stages between which the series circuit of the secondary winding and the terminating resistance is connected thereby supply signals that are in phase opposition to one another. The phase opposition can for example be achieved in that both push-pull output stages are driven by the same signal, respectively representing the measurement value, whereby one of the push-pull output stages is constructed so as to be inverting and the other is non-inverting. Alternatively, both push-pull output stages can have transmission characteristics with the same phase, but can be driven in phase-opposed fashion. The advantage of this is that, given a unipolar supply voltage, both positive and negative compensation currents can be produced. It is true that the output voltage proportional to the current to be measured is not voltage to ground, but the further processing of what are called floating voltages is unproblematic with a difference amplifier.

In a development of the invention, it is provided that the amplifiers respectively have an operational amplifier, that the non-inverting inputs of the operational amplifiers are connected with a reference potential, and that the supply of voltage to the operational amplifiers respectively takes place with the intermediate connection of a first or, respectively, second resistance of a positive supply potential or, respectively, a reference potential. In addition, two output stage transistors are respectively provided whose base terminals are connected to the supply terminals of the respective operational amplifier, and are thus coupled with the supply potential or, respectively, with the reference potential via the first resistance or, respectively, the second resistance.

The emitter of each output stage transistor, which is of one conductivity type, is connected to the supply potential, and the respective other output stage transistor, which is of the other conductivity type, is connected to the reference potential. The collectors of both output stage transistors—forming the output of the respective amplifier, and thereby an output of the driver circuit—are thereby coupled with one another, whereby the secondary winding and the terminating resistance connected in series thereto are connected, on the one hand, between the coupled emitters of the output stage transistors of the one amplifier, and the coupled emitters of the output stage transistors of the other amplifier on the other hand. Finally, the inverting input of one of the operational amplifiers is connected to the output of the evaluation circuit, and the inverting input of the other operational amplifier is connected to the input or output of the other operational amplifier. The advantage is that by means of the quiescent current of the respective operational amplifier a base-emitter bias voltage already arises for the associated output stage transistors at the correspondingly dimensioned resistances. By this means, the takeover region is already strongly reduced, without a quiescent current flowing in the output stage transistors, and without having to resort to additional measures.

It is thereby preferable that a third resistance be connected between the coupled emitters of the output stage transistors and the output of the one operational amplifier, as well as between the coupled emitters of the output stage transistors and the output of the other operational amplifier. Given smaller output currents, the two output stage transistors are each blocked, and the respective operational amplifier produces the output current. Given larger output currents, they become conductive, and supply the greater part of the output current.

An evaluation circuit, for the processing of the measurement value provided by the sensor, is preferably connected between the sensor and the driver circuit. The output signal of the sensor can thereby advantageously be adapted to the respective input-side requirements of the driver circuit.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a first general embodiment of an inventive current sensor,

FIG. 2 shows a second general embodiment of an inventive current sensor,

FIG. 3 shows a third general embodiment of an inventive current sensor,

FIG. 4 shows a fourth embodiment relating to a preferred construction of an inventive current sensor, FIG. 5 shows a current sensor according to the prior art.

DESCRIPTION OF THE PREFERRED EMBODIMENTS

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

In the embodiment according to FIG. 1, a current $i_1$ to be measured is conducted through a primary winding 1 of a current transformer, which in addition comprises a magnet core 2 as well as a secondary coil 6 magnetically coupled via the magnet core 2. A sensor 3 is thereby coupled with the magnet core 2 in such a way that it measures the magnetic flux in the magnet core 2. The sensor 3 consists for example of a transformer driven to saturation with a rectangular magnetization characteristic, or a Hall sensor. An evaluation circuit 4 connected downstream from the sensor processes the linear measurement value supplied by the sensor 3, and forwards the processed, e.g. amplified and filtered, measurement value to a driver circuit 5. The driver circuit 5 thereby comprises a non-inverting amplifier 5a and an inverting amplifier 5b, whose inputs are connected parallel to one another and are connected to the output of the evaluation circuit 4. The series circuit of the secondary winding 6 and terminating resistance 7 is connected between the outputs of the amplifiers 5a and 5b. The voltage dropped over the resistance 7, which voltage is proportional to the current $i_1$ to be measured, is picked off by means of a difference amplifier 8, and is available at the output thereof as an output voltage Ua, e.g. related to a reference potential G.

In relation to the embodiment according to FIG. 1, the one shown in FIG. 2 is modified in that the input of the inverting amplifier 5b is not connected in parallel to the input of the non-inverting amplifier 5a, but rather is connected to the output thereof. The embodiment according to FIG. 3 is based on the embodiment according to FIG. 2 in that an inverting amplifier 5c is provided in place of the non-inverting amplifier 5a.

According to FIG. 4, the driver circuit 5 from FIG. 3 preferably contains an operational amplifier 10 whose inverting input is, on the one hand, connected to the sensor 3 via a resistance 21 (the evaluation circuit 4 can hereby for example be omitted), and, on the other hand, with its output via a resistance 12. The non-inverting input thereof is connected on the one hand with the reference potential G via a resistance 25 and on the other hand is connected via a resistance 24 forming a reference potential R. The operational amplifier 10 is thus connected as an inverting amplifier 5c with the resistances 21 and 22. In addition, the output of the operational amplifier 10 is coupled with a positive supply potential V via a resistance 13 and is coupled with the reference potential G via a resistance 14. The two resistances 13 and 14 can however also be omitted if necessary. The supply of voltage to the operational amplifier 10 respectively takes place with the intermediate connection of a resistance 15 or, respectively, 16 of a positive supply potential V or, respectively, of the reference potential G. The two voltage supply branches serve in addition for the driving of two output stage transistors 17 and 18. The base terminals thereof are respectively connected to the supply terminals of the operational amplifier 10, and are thus coupled with the positive supply potential V or, respectively, with the reference potential G via the resistance 15 or, respectively, the resistance 16. The emitter of the transistor 17, which is of the pnp type, is connected to the positive supply potential V, and the transistor 18, which is of the npn type, is connected to the reference potential G. The collectors of the two transistors 17 and 18 are coupled with one another—forming the output of the push-pull output stage and thereby an output of the driver circuit 5—and are connected to the positive supply potential V or, respectively, to the the reference potential G via a respective diode 19 or, respectively, 20 acting as a free-wheeling diode in the blocking direction. Finally, a resistance 23 is connected between the output of the operational amplifier 10 and the coupled collectors of the transistors 17 and 18.

In addition, an identically constructed additional push-pull output stage with the transistors 17' and 18', with the diodes 19' and 20', the resistances 13' to 16', 21' to 25', as well as an operational amplifier 10', is provided. The secondary winding 6 and the terminating resistance 7 connected in series thereto are thereby connected between the coupled emitters of the transistors 17 and 18 on the one hand and the coupled emitters of the transistors 17' and 18' on the other hand. The non-inverting input of the operational amplifier 10' is finally connected to a reference potential R, and the inverting input thereof is connected to the output of the operational amplifier 10, with the intermediate connection of a resistance 23.

A current $i_2$ is thereby conducted through the secondary winding 6 and the terminating resistance 7, which current is on the one hand supposed to compensate the magnetic flux—caused by the current $i_1$—in the magnet core 2, and on the other hand is supposed to produce a voltage drop over the terminating resistance 7. The voltage drop over the resistance 7 thereby forms the input quantity for the difference amplifier 8 at whose output the voltage U, proportional to the current $i_1$ to be measured, is present. In the embodiment according to FIG. 4, only one unipolar voltage supply is used. Given the same characteristics as with bipolar feeding, the current sensor requires only half the supply voltage.

What is claimed is:

1. A current sensor according to the compensation principle, comprising:

a magnetic field produced by a primary winding through which current to be measured flows is compensated by a compensation current in a secondary winding;

for controlling the compensation current at least one sensor that is influenced by the magnetic field acquires deviations from a zero current and supplies a measurement value of the deviation to a driver circuit for the compensation current;

at the output of the driver circuit the secondary winding connected in series to a terminating resistance; a voltage that is proportional to the current to be measured being present at the terminating resistance;

the driver circuit being two amplifiers in a bridge circuit, which are controlled by the measurement value and which supply output signals in phase opposition to one another and which are connected to a unipolar voltage supply; and the series circuit of the secondary winding and terminating resistance being connected between outputs of the amplifiers.

2. The current sensor according to claim 1, wherein the driver circuit has two push-pull output stages as the two amplifiers, respectively.

3. The current sensor according to claim 1, wherein each of the two amplifiers respectively has an operational amplifier, and each of the operational amplifiers having a non-inverting input connected with a reference potential;

the voltage supply to each of the operational amplifiers respectively takes place with an intermediate connection of a first or, respectively, second resistance of a supply potential or, respectively, a reference potential; and wherein two output stage transistors respectively have base terminals respectively connected to supply terminals of the respective operational amplifier and coupled with the supply potential via the first resistance and with the reference potential via the second resistance;

wherein an emitter of a respective one output stage transistor of the two output stage transistors, which is of a first conductivity type connected to the supply potential, and a respective other output stage transistor, which is of a second conductivity type, is connected to the reference potential;

wherein respective collectors of both output stage transistors that form the output of the respective amplifier, and an output of the driver circuit are coupled with one another;

wherein the secondary winding and the terminating resistance connected in series thereto are connected between the coupled emitters of the output stage transistors of the first amplifier, and the coupled emitters of the output stage transistors of the second amplifier;

wherein an inverting input of one of the operational amplifiers is driven by the measurement value supplied by the sensor; and wherein an inverting input of the second operational amplifier is connected to one of the first operational amplifier.

4. The current sensor according to claim 3, wherein a third resistance is respectively connected between the coupled emitters of the output stage transistors and the output of the first operational amplifier and between the coupled emitters of the output stage transistors and the output of the second operational amplifier.

5. The current sensor according to claim 1, wherein the current sensor further comprises an evaluation circuit that is connected between the sensor and the driver circuit for processing of the measurement value provided by the sensor.

* * * * *